(12) United States Patent
Thomson et al.

(10) Patent No.: US 9,319,180 B2
(45) Date of Patent: Apr. 19, 2016

(54) PARTITIONING FORWARD ERROR CORRECTION DECODING ITERATIONS TO ACCOMMODATE MULTIPLE DATA STREAMS

(71) Applicant: Infinera Corporation, Sunnyvale, CA (US)

(72) Inventors: Sandy Thomson, Ottawa (CA); Han Sun, Ottawa (CA); John D. McNicol, Ottawa (CA)

(73) Assignee: Infinera Corporation, Sunnyvale, CA (US)

( * ) Notice: Subject to any disclaimer, the term of this patent is extended or adjusted under 35 U.S.C. 154(b) by 106 days.

(21) Appl. No.: 14/319,354

(22) Filed: Jun. 30, 2014

(65) Prior Publication Data

US 2015/0381315 A1    Dec. 31, 2015

(51) Int. Cl.
*H03M 13/00* (2006.01)
*H04L 1/00* (2006.01)
*H03M 13/29* (2006.01)

(52) U.S. Cl.
CPC ......... *H04L 1/0045* (2013.01); *H03M 13/2957* (2013.01); *H04L 1/0051* (2013.01); *H04L 1/0057* (2013.01)

(58) Field of Classification Search
CPC ..... H04L 1/005; H04L 1/0051; H04L 1/0057; H03M 13/2957; H03M 13/15
See application file for complete search history.

(56) References Cited

U.S. PATENT DOCUMENTS

| | | | | |
|---|---|---|---|---|
| 6,366,959 B1 * | 4/2002 | Sidhu | .................... | H04J 3/0632 709/214 |
| 6,493,846 B1 * | 12/2002 | Kondo | ............... | G11B 20/1426 341/59 |
| 7,003,712 B2 * | 2/2006 | Martinian | ............. | H03M 13/03 714/761 |
| 7,243,296 B2 * | 7/2007 | Christensen | ........ | H03M 13/098 714/758 |
| 8,090,412 B2 * | 1/2012 | Garrett | .................. | H04W 88/08 370/328 |
| 8,229,983 B2 * | 7/2012 | Walker | ............. | H04N 21/23439 348/14.01 |
| 8,327,251 B2 * | 12/2012 | Shinagawa | .......... | H03M 13/036 714/807 |
| 8,406,211 B2 * | 3/2013 | Raith | .................... | H04L 1/0041 370/349 |

OTHER PUBLICATIONS

Wikipedia, "Forward error correction", http://en.wikipedia.org/wiki/Forward_error_correction, May 24, 2014, 9 pages.

* cited by examiner

*Primary Examiner* — Esaw Abraham
(74) *Attorney, Agent, or Firm* — Harrity & Harrity LLP; David L. Soltz (57) ABSTRACT

An optical receiver may receive a data stream, and may decode the data stream using a first iterative forward error correction (FEC) decoder. The optical receiver may determine whether to further decode the data stream using the first iterative FEC decoder or a second iterative FEC decoder that is different from the first iterative FEC decoder. The optical receiver may selectively perform a first action or a section action based on determining whether to further decode the data stream. The first action may include providing the data stream to the first iterative FEC decoder or the second iterative FEC decoder for further decoding when the data stream is to be further decoded. The second action may include preventing the data stream from being provided to the first iterative FEC decoder or the second iterative FEC decoder when the data stream is not to be further decoded.

20 Claims, 9 Drawing Sheets

PARTITIONING FORWARD ERROR CORRECTION DECODING ITERATIONS TO ACCOMMODATE MULTIPLE DATA STREAMS

BACKGROUND

Forward error correction (FEC) is a technique used for correcting errors in data transmission over unreliable or noisy communication channels. When using FEC, a transmitter may encode a message in a redundant manner by using an error-correcting code. This redundancy may permit a receiver to detect and correct errors in the message without requiring retransmission of the message. Furthermore, iterative error correction (e.g., where an error-correcting technique is repeatedly applied to received data) may be used to increase the accuracy of the corrected data.

SUMMARY

According to some possible implementations, an optical receiver may include a decoder system. The decoder system may receive a data stream, and may decode the data stream using a first set of forward error correction (FEC) decoders. The decoder system may determine whether to further decode the data stream using the first set of FEC decoders or a second set of FEC decoders. The second set of FEC decoders may be different from the first set of FEC decoders. The decoder system may selectively perform a first action or a second action based on determining whether to further decode the data stream. The first action may include providing the data stream to the first set of FEC decoders or the second set of FEC decoders for further decoding when the data stream is to be further decoded. The second action may include outputting the data stream, without further decoding the data stream using the first set of FEC decoders or the second set of FEC decoders, when the data stream is not to be further decoded.

According to some possible implementations, a system may include an optical receiver. The optical receiver may receive a data stream, and may decode the data stream using a first iterative forward error correction (FEC) decoder. The optical receiver may determine whether to further decode the data stream using the first iterative FEC decoder or a second iterative FEC decoder. The second iterative FEC decoder may be different from the first iterative FEC decoder. The optical receiver may selectively perform a first action or a section action based on determining whether to further decode the data stream. The first action may include providing the data stream to the first iterative FEC decoder or the second iterative FEC decoder for further decoding when the data stream is to be further decoded. The second action may include preventing the data stream from being provided to the first iterative FEC decoder or the second iterative FEC decoder when the data stream is not to be further decoded.

According to some possible implementations, a method may include receiving, by an optical receiver, a data stream. The method may include decoding, by the optical receiver, the data stream using a first forward error correction (FEC) decoder. The method may include determining, by the optical receiver, whether to further decode the data stream using the first FEC decoder or a second FEC decoder. The second FEC decoder may be different from the first FEC decoder. The method may include selectively performing, by the optical receiver, a first action or a section action based on determining whether to further decode the data stream. The first action may include providing the data stream to the first FEC decoder or the second FEC decoder, for further decoding, based on determining that the data stream is to be further decoded. The second action may include preventing the data stream from being provided to the first FEC decoder or the second FEC decoder, for further decoding, based on determining that the data stream is not to be further decoded.

DETAILED DESCRIPTION

The following detailed description of example implementations refers to the accompanying drawings. The same reference numbers in different drawings may identify the same or similar elements.

In digital communications and transmissions, forward error correction (FEC) may be used to correct errors in data transmitted over long and/or impaired links. A receiver may use multiple FEC decoders to iterate FEC decoding (e.g., by sequentially passing the data through a series of FEC decoders), thereby increasing the accuracy of corrected data. This iterative FEC decoding technique may be used to correct errors in data received from a single FEC encoder, and/or to correct data that has been interleaved (e.g., by a gain sharing circuit) from multiple synchronous data sources and transmitted via multiple data transmission links or channels. However, it may be difficult for a system that implements iterative FEC decoding to correct errors in data received from multiple asynchronous data sources (e.g., received from different locations and/or at different times). Implementations described herein assist in using iterative FEC decoding to correct data originating from one or more asynchronous data sources.

Figure 1:
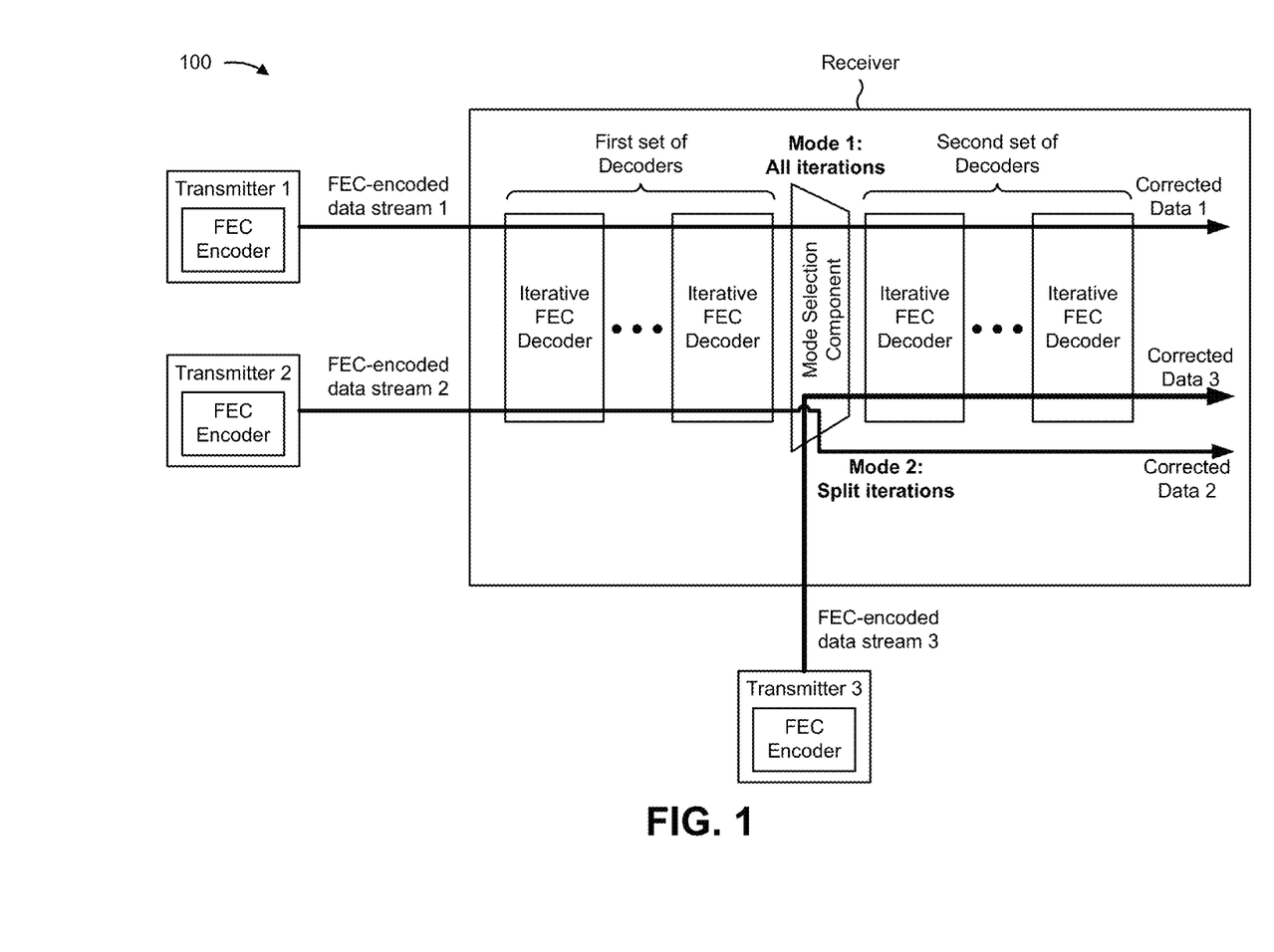
FIG. 1 is a diagram of an overview of an example implementation described herein.

FIG. 1 is a diagram of an overview of an example implementation 100 described herein. As shown in FIG. 1, a receiver may include a mode selection component (e.g., a multiplexer, a switch, etc.), which may be used to control a manner in which iterative FEC decoding is performed on an incoming data stream. For example, the receiver may include multiple iterative FEC decoders, shown as a first set of decoders and a second set of decoders, and the mode selection component may identify which iterative FEC decoders are to be used to decode an incoming FEC-encoded data stream.

As further shown in FIG. 1, assume that a transmitter, shown as Transmitter 1, transmits a FEC-encoded data stream, shown as FEC-encoded data stream 1, to the receiver. As shown, assume that the mode selection component is configured to a first mode (Mode 1), which causes FEC-encoded data stream 1 to pass through all of the iterative FEC decoders to correct errors introduced on FEC-encoded data stream 1 during transmission. Thus, FEC-encoded data stream 1 is operated on by all of the iterative FEC decoders to produce corrected data, shown as corrected data 1.

As further shown in FIG. 1, assume that multiple transmitters, shown as Transmitter 2 and Transmitter 3, transmit separate FEC-encoded data streams, shown as FEC-encoded data stream 2 and FEC-encoded data stream 3, to the receiver. For example, assume that Transmitter 2 and Transmitter 3 transmit data from different geographic locations. As shown, assume that the mode selection component is configured to a second mode (Mode 2), which causes FEC-encoded data stream 2 to pass through a first set of iterative FEC decoders (but not a second set of iterative FEC decoders), and which causes FEC-encoded data stream 3 to pass through a second set of iterative FEC decoders (but not a first set of iterative FEC decoders). Thus, FEC-encoded data stream 2 is operated on by fewer than all of the iterative FEC decoders (e.g., a first half of the iterative FEC decoders) to produce corrected data, shown as corrected data 2. Likewise, FEC-encoded data stream 3 is operated on by fewer than all of the iterative FEC decoders (e.g., a second half of the iterative FEC decoders) to produce corrected data, shown as corrected data 3.

In this way, the receiver may be configured to flexibly handle iterative FEC decoding of incoming data streams. For example, the receiver may use iterative FEC decoding to decode data streams from a single source, data streams from multiple sources, synchronous data streams, asynchronous data streams etc.

Figure 2:
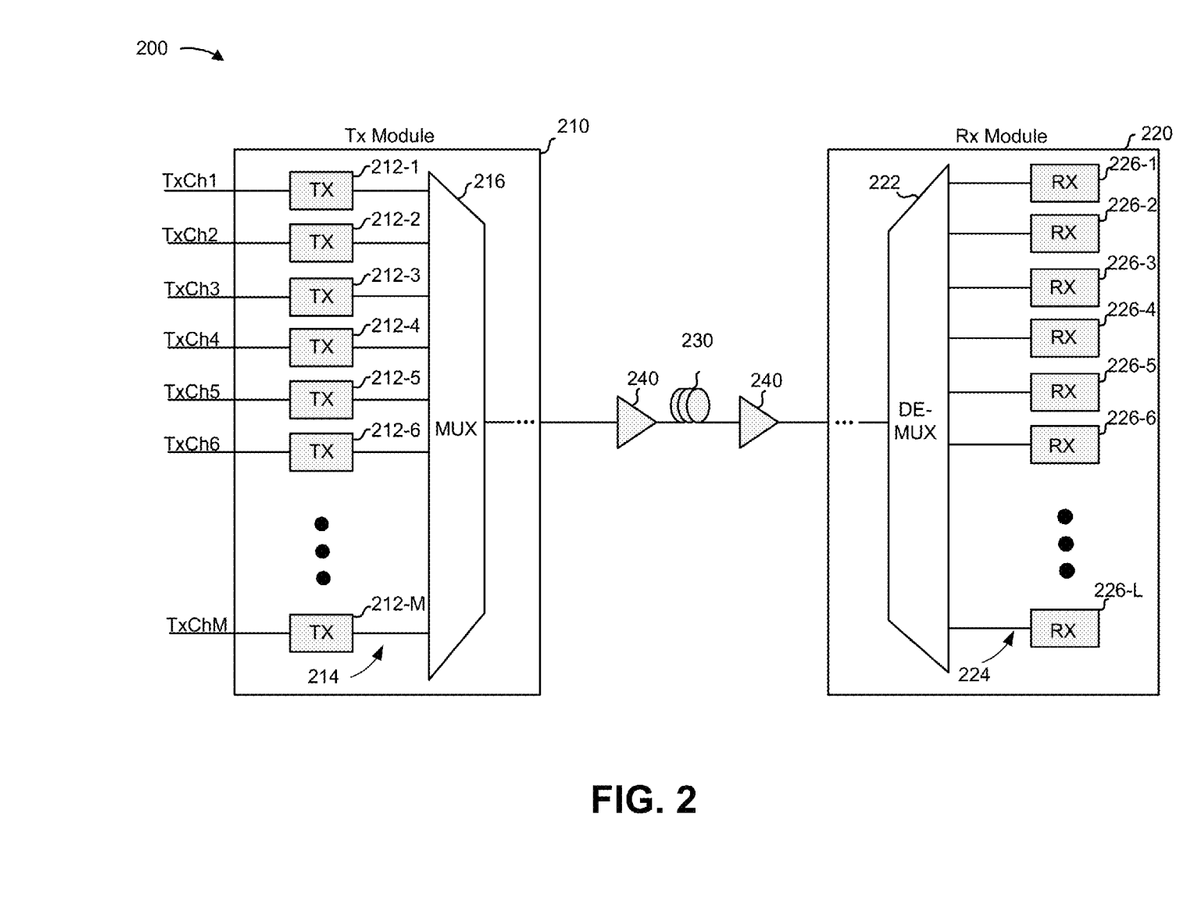
FIG. 2 is a diagram of an example network in which systems and/or methods, described herein, may be implemented.

FIG. 2 is a diagram of an example network 200 in which systems and/or methods, described herein, may be implemented. As shown in FIG. 2, network 200 may include a transmitter (Tx) module 210 (e.g., a Tx photonic integrated circuit (PIC)), and/or a receiver (Rx) module 220 (e.g., an Rx PIC). In some implementations, transmitter module 210 may be optically connected to receiver module 220 via link 230. Additionally, link 230 may include one or more optical amplifiers 240 that amplify an optical signal as the optical signal is transmitted over link 230.

Transmitter module 210 may include one or more optical transmitters 212-1 through 212-M (M≥1), one or more waveguides 214, and/or an optical multiplexer 216. In some implementations, transmitter module 210 may include additional components, fewer components, different components, or differently arranged components than those shown in FIG. 2.

Optical transmitter 212 may receive data for a data channel (shown as TxCh1 through TxChM), may create multiple sub-carriers for the data channel, may map data, for the data channel, to the multiple sub-carriers, may modulate the data with an optical signal (e.g., from a laser) to create a multiple sub-carrier output optical signal, and may transmit the multiple sub-carrier output optical signal. Optical transmitter 212 may be tuned to use an optical carrier of a designated wavelength. In some implementations, the grid of wavelengths emitted by optical transmitters 212 may conform to a known standard, such as a standard published by the Telecommunication Standardization Sector (ITU-T). Additionally, or alternatively the grid of wavelengths may be flexible and tightly packed to create a super channel.

Waveguide 214 may include an optical link or some other link to transmit output optical signals of optical transmitter 212. In some implementations, each optical transmitter 212 may include one waveguide 214, or multiple waveguides 214, to transmit output optical signals of optical transmitters 212 to optical multiplexer 216.

Optical multiplexer 216 may include an arrayed waveguide grating (AWG) or some other type of multiplexer device. In some implementations, optical multiplexer 216 may combine multiple output optical signals, associated with optical transmitters 212, into a single optical signal (e.g., a WDM signal). For example, optical multiplexer 216 may include an input (e.g., a first slab to receive input optical signals supplied by optical transmitters 212) and an output (e.g., a second slab to supply a single WDM signal associated with the input optical signals). Additionally, optical multiplexer 216 may include waveguides connected to the input and the output. In some implementations, optical multiplexer 216 may combine multiple output optical signals, associated with optical transmitters 212, in such a way as to produce a polarization diverse signal (e.g., also referred to herein as a WDM signal). As shown in FIG. 2, optical multiplexer 216 may provide the WDM signal to receiver module 220 via an optical fiber, such as link 230.

Optical multiplexer 216 may receive output optical signals outputted by optical transmitters 212, and may output one or more WDM signals. Each WDM signal may include one or more optical signals, such that each optical signal includes one or more wavelengths. In some implementations, one WDM signal may have a first polarization (e.g., a transverse magnetic (TM) polarization), and another WDM signal may have a second, substantially orthogonal polarization (e.g., a transverse electric (TE) polarization). Alternatively, both WDM signals may have the same polarization.

Link 230 may include an optical fiber. Link 230 may transport one or more optical signals associated with multiple wavelengths. Amplifier 240 may include an amplification device, such as a doped fiber amplifier, a Raman amplifier, or the like. Amplifier 240 may amplify the optical signals as the optical signals are transmitted via link 230.

Receiver module 220 may include an optical demultiplexer 222, one or more waveguides 224, and/or one or more optical receivers 226-1 through 226-L (L≥1). In some implementations, receiver module 220 may include additional components, fewer components, different components, or differently arranged components than those shown in FIG. 2.

Optical demultiplexer 222 may include an AWG or some other type of demultiplexer device. In some implementations, optical demultiplexer 222 may supply multiple optical signals based on receiving one or more optical signals, such as WDM signals, or components associated with the one or more optical signals. For example, optical demultiplexer 222 may include an input (e.g., a first slab to receive a WDM signal and/or some other input signal), and an output (e.g., a second slab to supply multiple optical signals associated with the WDM signal). Additionally, optical demultiplexer 222 may include waveguides connected to the input and the output. As shown in FIG. 2, optical demultiplexer 222 may supply optical signals to optical receivers 226 via waveguides 224.

Waveguide 224 may include an optical link or some other link to transmit optical signals, output from optical demultiplexer 222, to optical receivers 226. In some implementations, each optical receiver 226 may receive optical signals via a single waveguide 224 or via multiple waveguides 224.

Optical receiver 226 may include one or more photodetectors and/or similar devices to receive respective input optical signals outputted by optical demultiplexer 222, to detect sub-carriers associated with the input optical signals, to convert data within the sub-carriers to voltage signals, to convert the voltage signals to digital samples, and to process the digital samples to produce output data corresponding to the input optical signals. Optical receivers 226 may each operate to convert the input optical signal to an electrical signal that represents the transmitted data.

The number and arrangement of components shown in FIG. 2 is provided as an example. In practice, network 200 may include additional components, fewer components, different components, or differently arranged components than those shown in FIG. 2. Additionally, or alternatively, a set of devices (e.g., one or more devices) shown in FIG. 2 may perform one or more functions described herein as being performed by another set of devices shown in FIG. 2.

Figure 3:
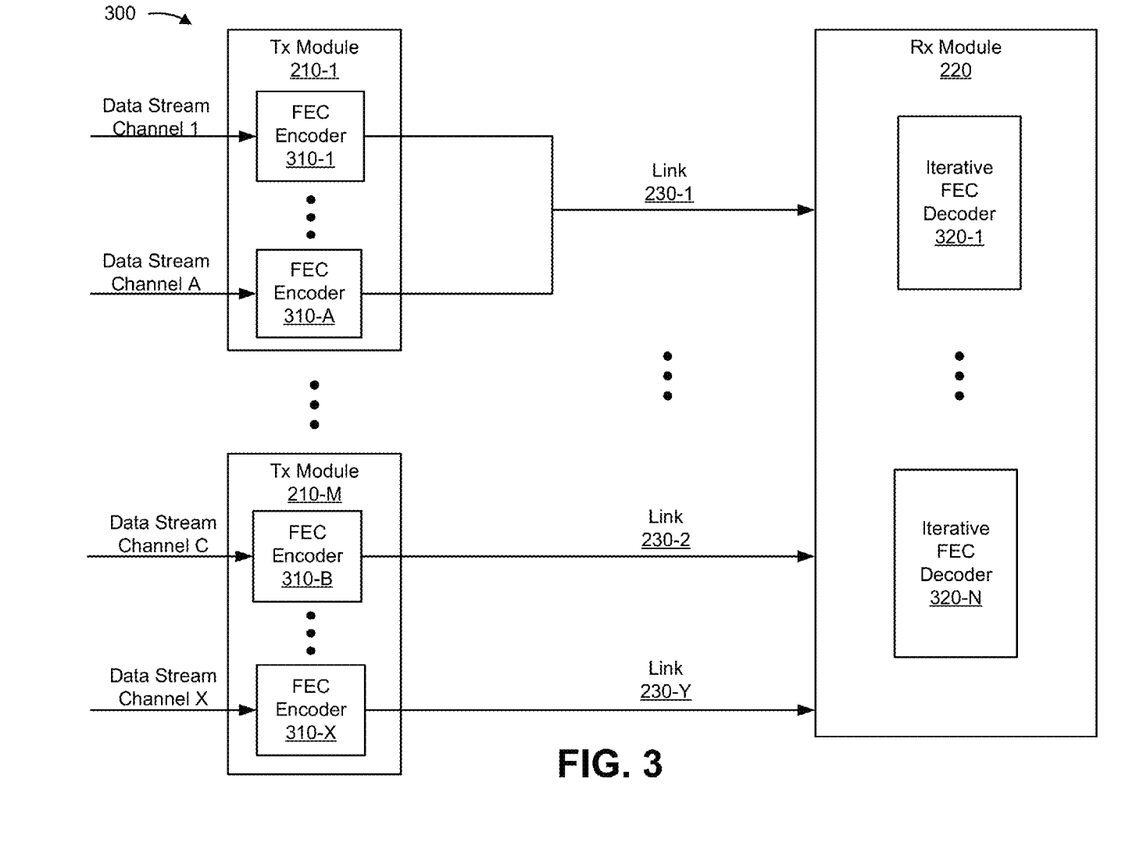
FIG. 3 is a diagram of example components of an optical transmitter and an optical receiver, that implement forward error correction, shown in FIG. 2.

FIG. 3 is a diagram of example components 300 of an optical transmitter and an optical receiver shown in FIG. 2. As shown in FIG. 3, Tx module 210 may include one or more FEC encoders 310, and Rx module 220 may include one or more iterative FEC decoders 320. As further shown in FIG. 3, data from multiple FEC encoders 310 may be combined and transmitted via a same link 230 (e.g., a same channel), or data from multiple FEC encoders 310 may be transmitted via separate links (e.g., from different Tx modules 210 and/or from within a single Tx module 210).

FEC encoder 310 may include one or more components capable of receiving a data stream, encoding the data stream with an error-correcting code, and transmitting the encoded data stream for FEC decoding by Rx module 220. For example, FEC encoder may include a circuit, such as a PIC, an application specific integrated circuit (ASIC), or the like. In some implementations, Tx module 210 may include other components for processing a data stream before, while, or after FEC encoder 310 encodes the data stream, such as a laser, a digital signal processor, a digital-to-analog converter, a modulator, etc.

Iterative FEC decoder 320 may include one or more components capable of receiving an encoded data stream (e.g., encoded using a forward error-correcting code), decoding the encoded data stream (e.g., using forward error correction), and transmitting the decoded data stream (e.g., to another iterative FEC decoder 320 and/or to another component). For example, iterative FEC decoder 320 may include a circuit, such as a PIC, an ASIC, or the like. In some implementations, multiple iterative FEC decoders 320 may be implemented in series, such that output (e.g., a decoded data stream) from a first iterative FEC decoder 320 is input to a second iterative FEC decoder 320, output from the second iterative FEC decoder 320 is input to a third iterative FEC decoder 320, etc. Additionally, or alternatively, Rx module 220 may implement a loop such that output from an iterative FEC decoder 320 is fed back as input to that iterative FEC decoder 320. In this case, Rx module 220 may buffer a new block of data in an input buffer while processing a previous block of data.

In some implementations, Rx module 220 may include other components for processing a data stream before, while, or after iterative FEC decoder 320 decodes the data stream, such as a photodetector, an analog-to-digital converter, a demodulator, a digital signal processor, etc. Additionally, or alternatively, Rx module 220 may include a mode selection component, a retiming component, a clock component, a mode input component, an input data buffer, an output data buffer, a data output switch, or the like, as described in more detail elsewhere herein.

The number and arrangement of components shown in FIG. 3 is provided as an example. In practice, Tx module 210 and/or Rx module 220 may include additional components, fewer components, different components, or differently arranged components than those shown in FIG. 3. Additionally, or alternatively, a set of components shown in FIG. 3 may perform one or more functions described herein as being performed by another set of components shown in FIG. 3.

Figure 4:
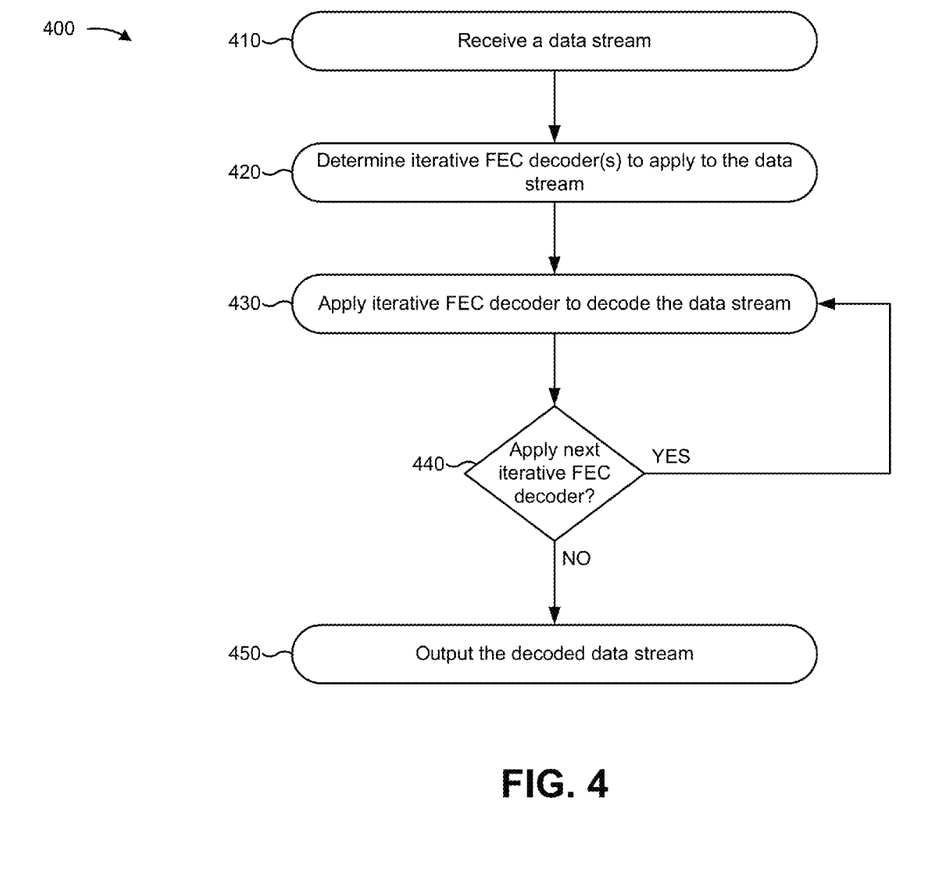
FIG. 4 is a flow chart of an example process for partitioning forward error correction decoding iterations to accommodate multiple data streams.

FIG. 4 is a flow chart of an example process 400 for partitioning forward error correction iterations to accommodate multiple data streams. In some implementations, one or more process blocks of FIG. 4 may be performed by Rx module 220. In some implementations, one or more process blocks of FIG. 4 may be performed by another device or a group of devices separate from or including Rx module 220, such as Tx module 210 and/or amplifier 240.

As shown in FIG. 4, process 400 may include receiving a data stream (block 410). For example, Rx module 220 may receive a data stream from Tx module 210 and/or amplifier 240. The data stream may include an optical data stream. Tx module 210 may encode the data stream using forward error correction encoding (e.g., using FEC encoder 310), and may transmit the data stream, via link 230, to Rx module 220. Transmission of the data stream via link 230 may introduce errors (e.g., noise, perturbations, etc.) into the data stream.

In some implementations, Rx module 220 may receive multiple data streams. The multiple data streams may each be encoded using different FEC encoders 310 included in the same Tx module 210, in some implementations. Additionally, or alternatively, the multiple data streams may each be encoded using different FEC encoders 310 included in different Tx modules 210 (e.g., which may be located in different geographic regions). The multiple data streams, received by Rx module 210, may be synchronous or asynchronous.

As further shown in FIG. 4, process 400 may include determining one or more iterative FEC decoders to apply to the data stream (block 420). For example, Rx module 220 may determine a particular iterative FEC decoder 320 to apply to the data stream, a set of iterative FEC decoders 320 to apply to the data stream, and/or a quantity of iterative FEC decoders 320 to apply to the data stream. In some implementations, Rx module 220 may determine an initial iterative FEC decoder 320 to apply to the data stream. Additionally, or alternatively, Rx module 220 may be configured to apply a particular iterative FEC decoder 320 to the data stream, may be configured to apply a set of iterative FEC decoders 320 to the data stream, may be configured to apply a particular quantity of iterative FEC decoders 320 to the data stream, may be configure to apply an initial iterative FEC decoder 320 to the data stream, etc. In some implementations, Rx module 220 may determine whether to decode and/or further decode a data stream by providing the data stream to a mode selection component configured to provide the data stream to a preconfigured set of iterative FEC decoders 320.

In some implementations, Rx module 220 may determine the initial iterative FEC decoder 320 to apply to the data stream based on framing information that encapsulates and/or is included in the data stream. Based on the framing information, Rx module 220 may determine to begin decoding the data stream using a first iterative FEC decoder 320 in a series of iterative FEC decoders 320. Alternatively, Rx module 220 may determine to begin decoding the data stream using an iterative FEC decoder 320 other than the first iterative FEC decoder 320 in the series of iterative FEC decoders 320.

For example, assume that Rx module 220 includes N iterative FEC decoders 320, and that Rx module 220 is configured to concurrently decode two data streams (e.g., a first data stream and a second data stream). In this case, Rx module 220 may begin decoding the first data stream using the first iterative FEC decoder 320 (e.g., Decoder 1), and may use N/2 iterative FEC decoders to decode the first data stream. In this case, Rx module 220 may process the first data stream using iterative FEC decoders 1 through N/2. Further, Rx module 220 may begin decoding the second data stream starting with N/2+1 iterative FEC decoder 320 (e.g., Decoder N/2+1), and may also use N/2 iterative FEC decoders to decode the second data stream. In this case, Rx module 220 may process the second data stream using iterative FEC decoders N/2+1 through N. In some implementations, the set of iterative FEC decoders 320 used to decode the first data stream and the set of iterative FEC decoders 320 used to decode the second data stream may be mutually exclusive.

The above is merely provided as an example. In some implementations, Rx module 220 may apply a same quantity of iterative FEC decoders 320 to different data streams, may apply a different quantity of iterative FEC decoders 320 to different data streams, may apply any quantity of iterative FEC decoders 320 to different data streams, etc. Additionally, or alternatively, Rx module 220 may partition a set of iterative FEC decoders 320 to decode more than two data streams. Additionally, or alternatively, a particular iterative FEC decoder 320 may be used to process a single data stream, may be used to process multiple data streams, etc.

In some implementations, Rx module 220 may process a single data stream of rate R. Additionally, or alternatively, Rx module 220 may process K asynchronous data streams of rate R/K. In this case, Rx module 220 may partition a set of N iterative FEC decoders 320 into K partitions that each includes N/K iterative FEC decoders 320. Alternatively, Rx module 220 may partition the set of N iterative FEC decoders 320 into K partitions that include a different quantity of iterative FEC decoders 320 (e.g., a quantity other than N/K). Additionally, or alternatively, Rx module 220 may process up to N synchronous data streams (e.g., where N is equal to the quantity of iterative FEC decoders 320) of rate R/N, assuming the N synchronous data streams are interleaved using gain sharing to encode and/or decode all of the data streams together.

As further shown in FIG. 4, process 400 may include applying an iterative FEC decoder to decode the data stream (block 430). For example, Rx module 220 may determine an initial iterative FEC decoder 320 to apply to a data stream, and may provide the data stream to the initial iterative FEC decoder 320. The initial iterative FEC decoder 320 may decode the data stream using FEC decoding.

In some implementations, Rx module 220 may set a clock rate to be used by iterative FEC decoder 320 when decoding the data stream. Rx module 220 may determine the clock rate based on the data stream (e.g., a frequency associated with the data stream). When decoding multiple data streams, Rx module 220 may determine different clock rates for different data streams (e.g., when the data streams are asynchronous). In this case, Rx module 220 may set a first clock rate for a first iterative FEC decoder 320 used to decode a first data stream, and may set a second clock rate for a second iterative FEC decoder 320 used to decode a second data stream.

As further shown in FIG. 4, process 400 may include determining whether to apply a next iterative FEC decoder (block 440). For example, Rx module 220 may determine whether to apply a next iterative FEC decoder 320 to the data stream. In some cases, Rx module 220 may be configured such that a data stream passes through a set of iterative FEC decoders 320 before Rx module 220 makes a decision as to whether to apply a next iterative FEC decoder 320 (e.g., another set of iterative FEC decoders 320) to the data stream. In this case, a first iterative FEC decoder 320 may pass the (decoded) data stream to a second iterative FEC decoder 320 without Rx module 220 making this determination.

In some cases, after passing through a set of iterative FEC decoders 320, Rx module 220 may pass the data stream to a mode selection component to determine whether to pass the data stream to another set of iterative FEC decoders 320. Rx module 220 may set different modes of the mode selection component to control whether the data stream is passed to another set of iterative FEC decoders 320. In other words, the mode selection component may be preconfigured to process the data stream in a particular manner (e.g., to provide the data stream to a particular set of iterative FEC decoders 320). Rx module 220 may determine whether to apply a next iterative FEC decoder 320 to a data stream by providing the data stream to the mode selection component, which may provide the data stream to an appropriate component (e.g., an iterative FEC decoder 320, a retiming component an output data buffer, an output component, etc.). Additionally, or alternatively, Rx module 220 may include a loop that iteratively passes a data stream through a set of iterative FEC decoders 320 until a condition is satisfied, as described in more detail elsewhere herein.

As further shown in FIG. 4, if a next iterative FEC decoder is to be applied (block 440—YES), then process 400 may return to block 430. For example, if Rx module 220 determines that the data stream is to be passed to another set of iterative FEC decoders 320, then Rx module 220 (e.g., the mode selection component) may pass the data stream to the next iterative FEC decoder 320 to continue decoding the data stream.

As further shown in FIG. 4, if a next iterative FEC decoder is not to be applied (block 440—NO), then process 400 may include outputting the data stream (block 450). For example, if Rx module 220 determines that the data stream is not to be passed to another set of iterative FEC decoders 320, then Rx module 220 (e.g., the mode selection component) may output the decoded data stream without applying additional iterative FEC decoders 320. In some implementations, Rx module 220 may retime the data stream (e.g., by applying a delay). For example, Rx module 220 may delay a first data stream to synchronize the first data stream with a second data stream (e.g., to which another set of iterative FEC decoders 320 is applied). In this way, Rx module 220 may be configured to apply iterative FEC decoders 320 to handle a single data stream, multiple data streams, synchronous data streams, asynchronous data streams, etc.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
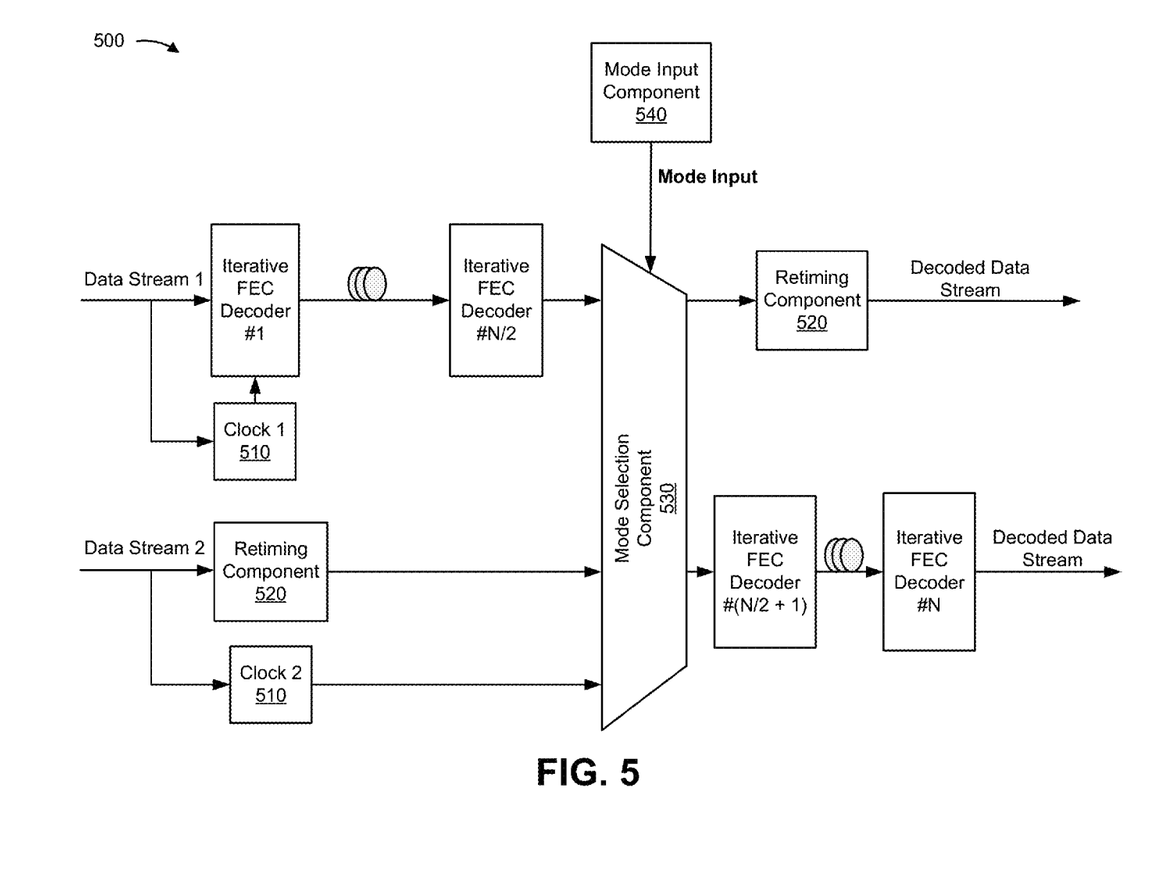
FIG. 5 is a diagram of an example implementation relating to the example process shown in FIG. 4.

FIG. 5 is a diagram of an example implementation 500 relating to example process 400 shown in FIG. 4. FIG. 5 shows an example of partitioning forward error correction decoding iterations to accommodate multiple data streams.

As shown in FIG. 5, assume that Rx module 220 receives a first data stream, shown as Data Stream 1, and a second data stream, shown as Data Stream 2. Assume that these data streams are framed to indicate a manner in which iterative FEC decoders 320 are to be applied to the data streams. For example, assume that the Data Stream 1 is to be passed to iterative FEC decoder #1. As further shown, assume that Rx module 220 uses a clock 510, shown as Clock 1, to determine a clock rate to be applied by iterative FEC decoders #1 through #N/2 when decoding Data Stream 1. As further shown, assume that Data Stream 1 passes through a set of iterative FEC decoders 320 beginning with iterative FEC decoder #1 and ending with iterative FEC decoder #N/2 (e.g., assuming there are N iterative FEC decoders 320 in Rx module 220).

As further shown in FIG. 5, assume that Data Stream 2 is not to be passed to iterative FEC decoder #1. In this case, Rx module 220 may pass Data Stream 2 to a retiming component 520 (e.g., a retime flip-flop, a set of flip-flops, a set of switches, a delay circuit, etc.), which may apply a delay to Data Stream 2 (e.g., based on an amount of time required to process Data Stream 1 via iterative FEC decoders #1 through #N/2). In some implementations, retiming component 520 may retime the data based on the data traveling a particular path on Rx module 220 (e.g., an ASIC), such as when the data must travel a particular distance. For example, Data Stream 2 may have a to travel a particular distance to reach mode selection component 530 and/or iterative FEC decoder #(N/2+1). In this way, Rx module 220 may synchronize output decoded data streams (e.g., decoded Data Stream 1 and decoded Data Stream 2). As further shown, assume that Rx module 220 uses another clock 510, shown as Clock 2, to determine a clock rate to be applied by iterative FEC decoders 320 that decode Data Stream 2.

As further shown in FIG. 5, assume that decoded Data Stream 1 and delayed Data Stream 2 (and Clock 2) are input to a mode selection component 530 (e.g., a switch, a multiplexer, a selection circuit, etc.). Further, assume that a mode input component 540 (e.g., a switch, a circuit, etc.) provides a mode input to mode selection component 530. Assume that the mode input indicates a manner in which data streams are to be processed (e.g., whether a data stream is to be decoded by iterative FEC decoders 320, whether a data stream is to be output without further decoding, etc.). In some implementations, the mode input may be pre-configured. Additionally, or alternatively, the mode input may be determined based on whether Rx module 220 is processing a single data stream (e.g., Mode 1) or multiple data streams that are to be concurrently processed (e.g., Mode 2).

Based on the mode input, mode selection component 530 may pass a data stream to a set of iterative FEC decoders 320, shown as iterative FEC decoder #(N/2+1) through iterative FEC decoder #N. Additionally, or alternatively, mode selection component 530 may pass a data stream to retiming component 520. Retiming component 520 may apply a delay to a data stream output from mode selection component 530 (e.g., based on an amount of time required to process a data string using iterative FEC decoders #(N/2+1) through #N). In this way, Rx module 220 may synchronize output decoded data streams (e.g., decoded Data Stream 1 and decoded Data Stream 2). As further shown, retiming component 520 and/or iterative FEC decoder #N may output decoded data streams.

In some implementations, Rx module 220 may include multiple mode selection components 530. For example, when Rx module 220 processes K data streams (e.g., K channels of data), the quantity of mode selection components 530 may be equal to K−1. Additionally, or alternatively, the quantity of iterative FEC decoders 320 (e.g., N) may be evenly divisible by K (e.g., without a remainder), so that each data stream may be processed by an equal quantity of iterative FEC decoders 320. In some implementations, Rx module 220 may use fewer than all of the iterative FEC decoders 320 included in Rx module 220 to ensure that each data stream is processed by an equal quantity of iterative FEC decoders 320. Alternatively, Rx module 220 may use a different quantity of iterative FEC decoders 320 for different data streams.

As indicated above, FIG. 5 is provided merely as an example. Other examples are possible and may differ from what was described with regard to FIG. 5.

Figure 6A:
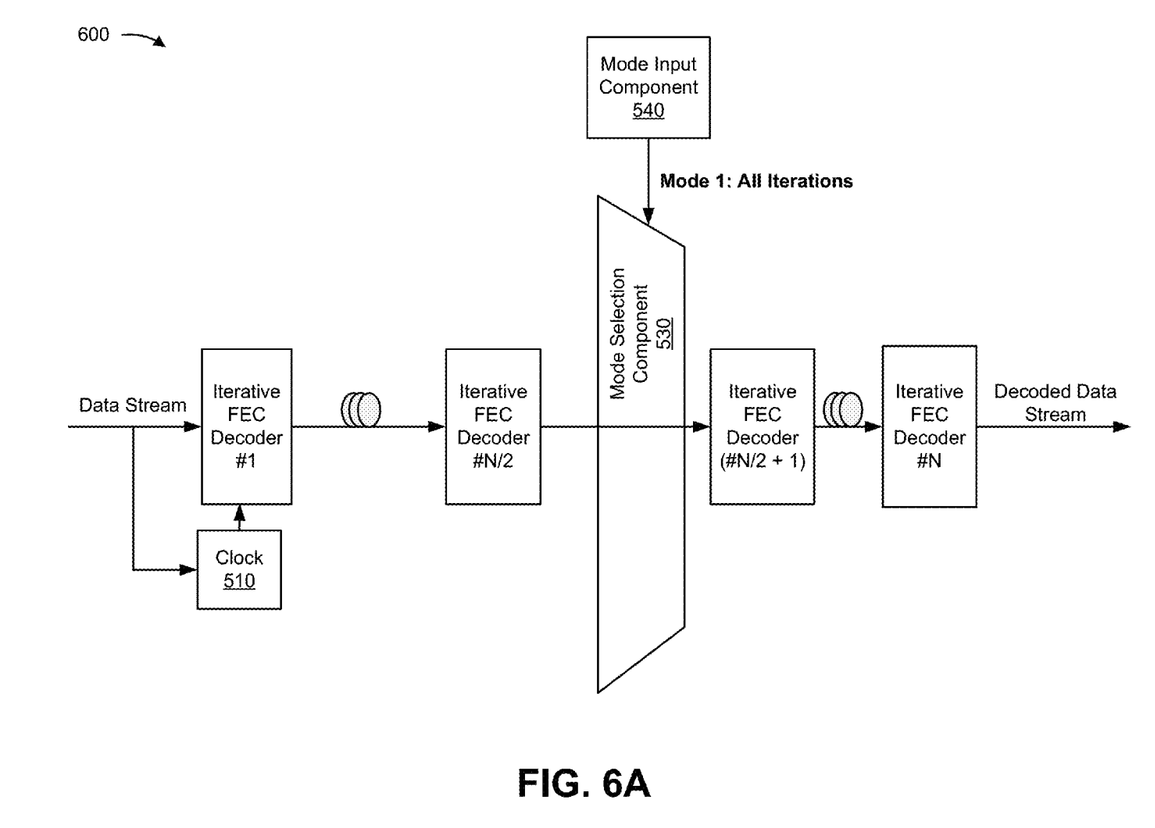
FIGS. 6A and 6B are diagrams of another example implementation relating to the example process shown in FIG. 4.
Figure 6B:
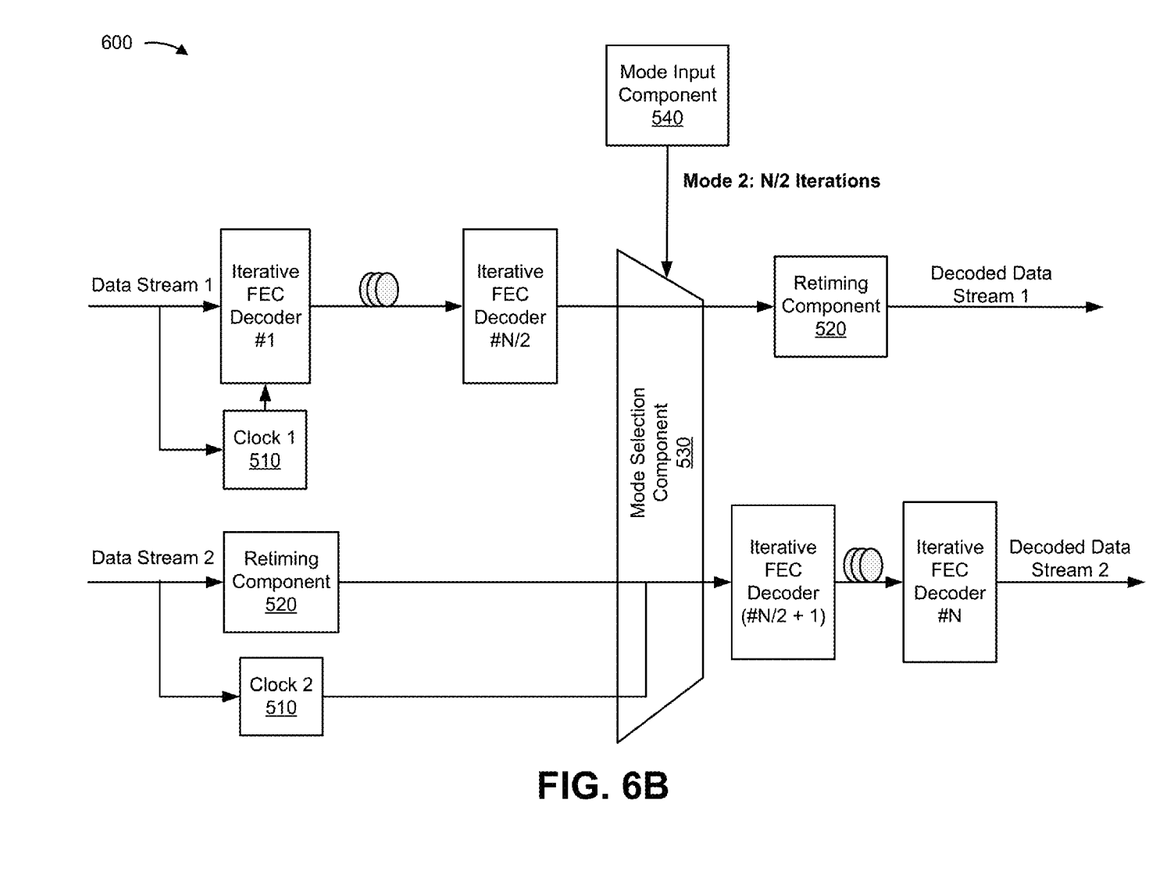

FIGS. 6A and 6B are diagrams of another example implementation 600 relating to example process 400 shown in FIG. 4. FIGS. 6A and 6B show examples of partitioning forward error correction decoding iterations to accommodate multiple data streams.

FIG. 6A shows an example of a first mode used by mode selection component 530 to pass a data stream through all iterative FEC decoders 320 included in Rx module 220. For the purpose of FIG. 6A, assume that Rx module 220 includes N iterative FEC decoders 320. As shown, assume that Rx module 220 receives a data stream, and determines to provide the data stream to a first set of iterative FEC decoders 320, shown as iterative FEC decoder #1 through iterative FEC decoder #N/2. As further shown, assume that Rx module 220 uses a clock 510 to set a clock rate at which all iterative FEC decoders 320 are to decode the data stream.

As shown, assume that the data stream is decoded by iterative FEC decoder #1 through iterative FEC decoder #N/2, and that the data stream is then passed to mode selection component 530. Further, assume that mode selection component 530 is programmed to process the data stream using a first mode (e.g., Mode 1), which indicates that the data stream is to be processed by all iterative FEC decoders 320. In this case, assume that mode selection component 530 passes the data stream to a second set of iterative FEC decoders 320, shown as iterative FEC decoder #(N/2+1) through iterative FEC decoder #N. As shown, assume that iterative FEC decoder #N outputs the decoded data stream. In this way, Rx module 220 may instruct mode selection component 530 to cause the data stream to be decoded by all iterative FEC decoders 320 included in Rx module 220.

FIG. 6B shows an example of a second mode used by mode selection component 530 to pass a data stream through fewer than all iterative FEC decoders 320 included in Rx module 220. For the purpose of FIG. 6B, assume that Rx module 220 includes N iterative FEC decoders 320.

As shown, assume that Rx module 220 receives a first data stream, shown as Data Stream 1, and determines to provide Data Stream 1 to a first set of iterative FEC decoders 320, shown as iterative FEC decoder #1 through iterative FEC decoder #N/2. As further shown, assume that Rx module 220 uses a first clock 510, shown as Clock 1, to set a clock rate at which iterative FEC decoders #1 through #N/2 are to decode Data Stream 1.

As shown, assume that Data Stream 1 is decoded by iterative FEC decoder #1 through iterative FEC decoder #N/2, and that Data Stream 1 is then passed to mode selection component 530. Further, assume that mode selection component 530 is programmed to process Data Stream 1 using a second mode (e.g., Mode 2), which indicates that Data Stream 1 is to be processed by N/2 iterative FEC decoders 320. In this case, assume that mode selection component 530 passes Data Stream 1 to retiming component 520. Retiming component 520 may apply a delay to Data Stream 1, while Data Stream 2 is processed by iterative FEC decoders #(N/2+1) through #N, before outputting Data Stream 1 as Decoded Data Stream 1.

As further shown, assume that Rx module 220 concurrently receives a second data stream, shown as Data Stream 2, and determines not to provide Data Stream 2 to the first set of iterative FEC decoders 320 (e.g., iterative FEC decoders #1 through #N/2). Thus, as further shown, assume that Rx module 220 provides Data Stream 2 to retiming component 520 to apply a delay to Data Stream 2, while Data Stream 1 is processed by iterative FEC decoders #1 through #N/2, before providing Data Stream 2 to mode selection component 530. As further shown, assume that Rx module 220 uses a second clock 510, shown as Clock 2, to set a clock rate at which iterative FEC decoders #(N/2+1) through #N are to decode Data Stream 2.

As shown, assume that retiming component 520 passes Data Stream 2 to mode selection component 530, and that Clock 2 is also passed to mode selection component 530 (e.g., to be provided to iterative FEC decoder #(N/2+1)). Further, assume that mode selection component 530 is programmed to process Data Stream 2 using a second mode (e.g., Mode 2), which indicates that Data Stream 2 is to be processed by N/2 iterative FEC decoders 320. In this case, assume that mode selection component 530 passes Data Stream 2 to a second set of iterative FEC decoders 320 (e.g., iterative FEC decoders #(N/2+1) through #N). As further shown, assume that iterative FEC decoders #(N/2+1) through #N use a clock rate indicated by Clock 2 to decode Data Stream 2. Assume that the second set of iterative FEC decoders 320 decode Data Stream 2, and output Data Stream 2 as Decoded Data Stream 2.

In this way, Rx module 220 may instruct mode selection component 530 to cause the different data streams to be concurrently decoded by fewer than all iterative FEC decoders 320 included in Rx module 220. In this example, Rx module 220 causes each of the two data streams to be decoded by 50% of the iterative FEC decoders 320. However, in some implementations, Rx module 220 may use a different percentage of iterative FEC decoders 320 to decode each data stream.

As indicated above, FIGS. 6A and 6B are provided merely as an example. Other examples are possible and may differ from what was described with regard to FIGS. 6A and 6B.

Figure 7A:
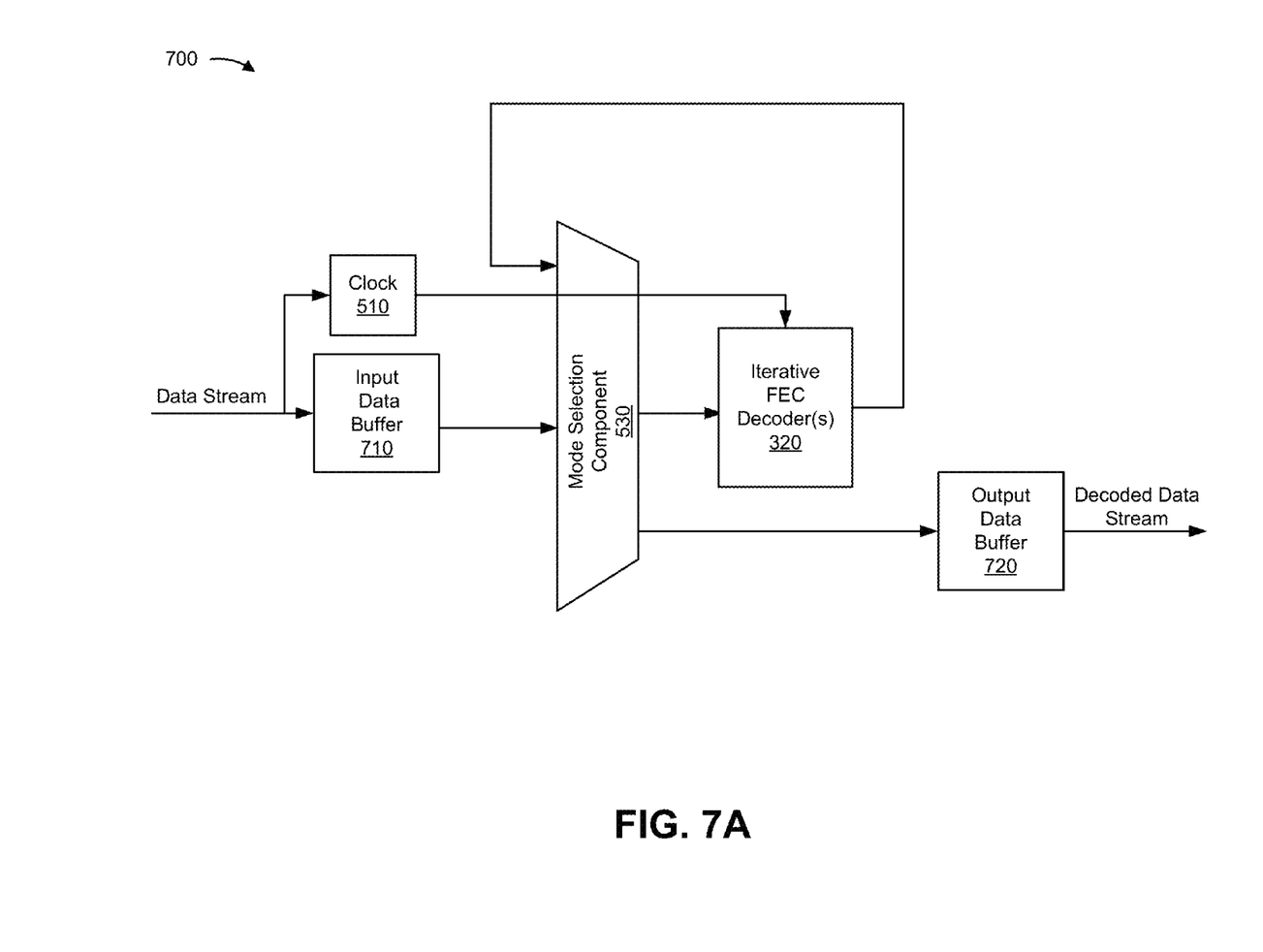
FIGS. 7A and 7B are diagrams of another example implementation relating to the example process shown in FIG. 4.
Figure 7B:
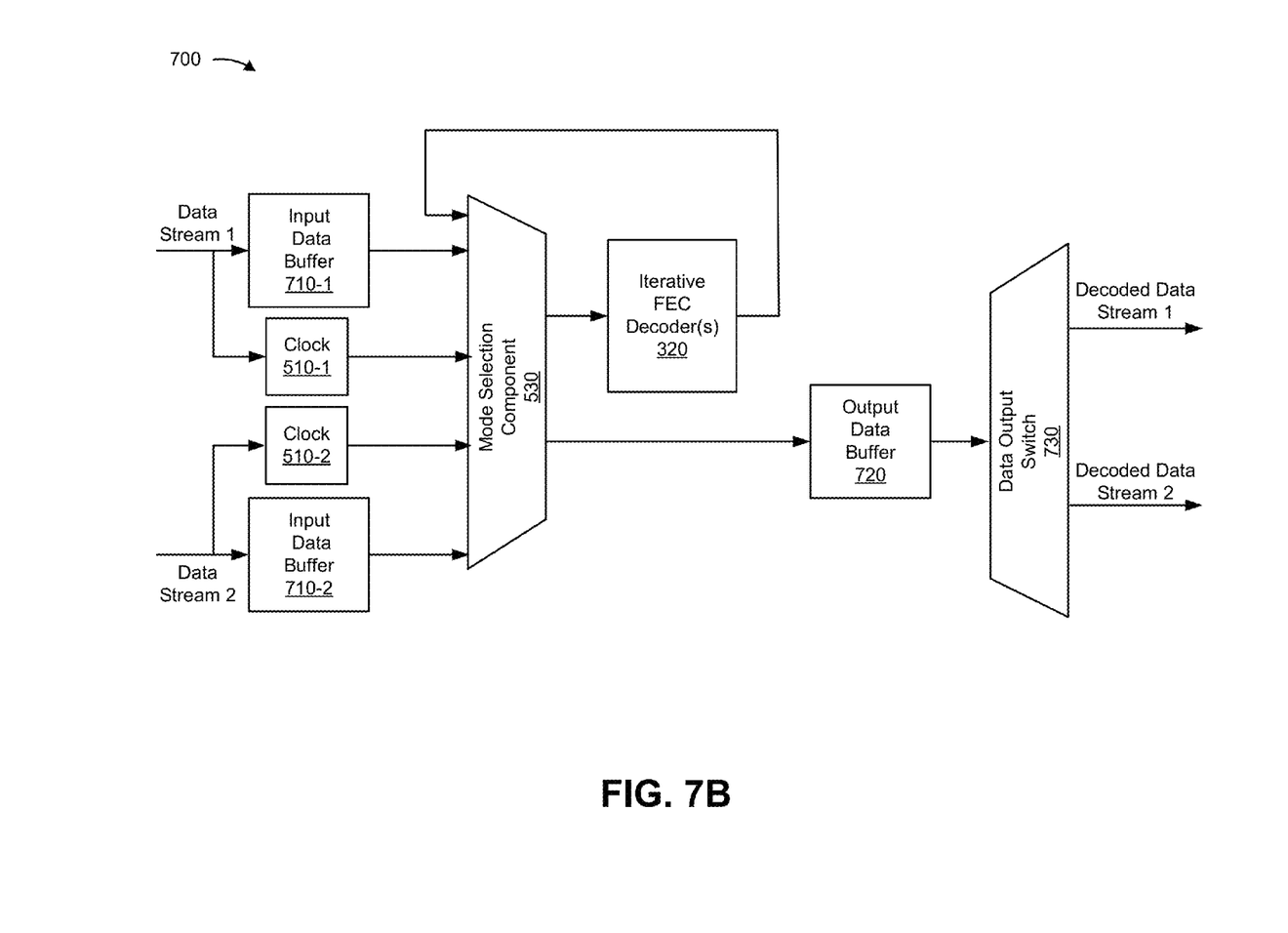

FIGS. 7A and 7B are diagrams of another example implementation 700 relating to example process 400 shown in FIG. 4. FIGS. 7A and 7B show examples of buffering data streams to partition forward error correction decoding iterations to accommodate multiple data streams.

As shown in FIG. 7A, assume that Rx module 220 receives a data stream, and provides the data stream to input data buffer 710 (e.g., a circuit, a buffer, a storage component, etc.). As further shown, assume that Rx module 220 uses clock 510 to set a clock rate at which a set of iterative FEC decoders 320 are to decode the data stream. Assume that input data buffer 710 buffers (e.g., stores) the data stream as the data stream is received. Based on a particular condition being satisfied (e.g., the buffer being filled to a particular percentage of the buffer capacity), assume that input data buffer 710 provides the stored data stream to mode selection component 530.

Assume that mode selection component 530 determines whether to provide the data stream to a set of iterative FEC decoders 320 for decoding, or whether to provide the data stream to an output data buffer 720 (e.g., a circuit, a buffer, a storage component, etc.) for further processing (e.g., after the data stream has been decoded). As an example, when a data stream is initially received by mode selection component 530, mode selection component 530 may provide the data stream to the set of iterative FEC decoders 320 (e.g., which may include one or more iterative FEC decoders 320). The set of iterative FEC decoders 320 may decode the data stream (e.g., at a clock rate set by clock 510), and may provide the data stream back to mode selection component 530. Mode selection component 530 may then determine whether to again provide the data stream to the set of iterative FEC decoders 320, or whether to output the data stream to output data buffer 720.

In some implementations, mode selection component 530 may track a quantity of times that a data stream has been passed to and/or decoded by the set of iterative FEC decoders 320. When the quantity satisfies a threshold, mode selection component 530 may output the data stream to output data buffer 720. Additionally, or alternatively, mode selection component 530 may receive an indication, from input data buffer 710, that a next data stream is ready to be passed to mode selection component 530 (e.g., and/or may receive the next data stream from input data buffer 710). In this case, mode selection component 530 may pass the next data stream to the set of iterative FEC decoders 320, and may pass the previous data stream (e.g., after mode selection component 530 receives the previous data stream from the set of iterative FEC decoders 320) to output data buffer 720. Output data buffer 720 may buffer the data stream, and may output the data stream as a decoded data stream (e.g., may apply a delay to synchronize the data stream while the next data stream is decoded). In some implementations, output data buffer 720 may be used when the quantity of FEC iterations on a data stream is variable. In this case, using output data buffer 720 may allow Rx module 220 to maintain a constant throughput of data. In this way, Rx module 220 may use mode selection component 530 to control a manner in which a data stream is decoded by iterative FEC decoder(s) 320.

As shown in FIG. 7B, assume that Rx module 220 receives a first data stream, shown as Data Stream 1, and provides Data Stream 1 to a first input data buffer 710-1. As further shown, assume that Rx module 220 uses a first clock 510-1 to set a clock rate at which a set of iterative FEC decoders 320 are to decode Data Stream 1. As further shown, assume that Rx module 220 receives a second data stream, shown as Data Stream 2, and provides Data Stream 2 to a second input data buffer 710-2. Further, assume that Rx module 220 uses a second clock 510-2 to set a clock rate at which a set of iterative FEC decoders 320 are to decode Data Stream 2.

Assume that input data buffer 710-1 buffers Data Stream 1, and that input data buffer 710-2 buffers Data Stream 2. Based on a particular condition being satisfied (e.g., the buffer being filled to a particular percentage of the buffer capacity), assume that input data buffers 710 provide the respective stored data streams to mode selection component 530.

As described above, assume that mode selection component 530 determines whether to provide a received data stream to a set of iterative FEC decoders 320 for decoding, or whether to provide the received data stream to an output data buffer 720. As an example, mode selection component 530 may alternate between receiving buffered Data Stream 1 from input data buffer 710-1 and buffered Data Stream 2 from input data buffer 710-2. In this case, mode selection component 530 may instruct the set of iterative FEC decoders 320 to use a first clock rate, set by clock 510-1, when decoding Data Stream 1, and to use a second clock rate, set by clock 510-2, when decoding Data Stream 2. Additionally, or alternatively, mode selection component 530 may instruct the set of iterative FEC decoders 320 to use a same clock rate when decoding either data stream.

As an example, assume that mode selection component 530 receives buffered Data Stream 1 from input data buffer 710-1. Further, assume that mode selection component 530 provides buffered Data Stream 1 to the set of iterative FEC decoders 320 for decoding (e.g., using a clock rate set by clock 510-1). Assume that the set of iterative FEC decoders 320 processes Data Stream 1 and provides Data Stream 1 back to mode selection component 530. Assume that mode selection component 530 has not yet received buffered Data Stream 2 from input data buffer 710-2 (or that a quantity of times that Data Stream 1 has been provided to and/or processed by the set of iterative FEC decoders 320 does not satisfy a threshold). In this case, mode selection component 530 may continue to provide Data Stream 1 to the set of iterative FEC decoders 320 (e.g., until a condition is satisfied)

Assume that, at a later time, mode selection component 530 receives buffered Data Stream 2 from input data buffer 710-2. Further, assume that mode selection component 530 provides buffered Data Stream 2 to the set of iterative FEC decoders 320 for decoding (e.g., using a clock rate set by clock 510-2). Assume that mode selection component 530 then receives Data Stream 1 from the set of iterative FEC decoders 320. In this case, mode selection component 530 may provide Data Stream 1 to output data buffer 720 (e.g., since mode selection component 530 has received Data Stream 2 and provided Data Stream 2 to the set of iterative FEC decoders 320). Output data buffer 720 may buffer Data Stream 1, and may provide Data Stream 1 to a data output switch 730 (e.g., a circuit, a switch, etc.).

Data output switch 730 may determine (e.g., based on an indication received from mode selection component 530 and/or output data buffer 720) whether the received data stream is part of Data Stream 1 or Data Stream 2. Based on this determination, data output switch 730 may output the received data stream on a particular path, shown as Decoded Data Stream 1 or Decoded Data Stream 2.

Mode selection component 530 may continue to provide Data Stream 2 to the set of iterative FEC decoders 320 until a condition is satisfied (e.g., a particular quantity of iterations have been performed; another data stream, such as Data Stream 1, has been received by mode selection component 530; etc.). When the condition is satisfied, mode selection component 530 may provide Data Stream 2 to output data buffer 720. Output data buffer 720 and data output switch 730 may process Data Stream 2 in a similar manner as described above in connection with Data Stream 1. In this way, Rx module 220 may use mode selection component 530 to control a manner in which multiple data stream are decoded by iterative FEC decoder(s) 320.

In the examples shown in FIGS. 7A and 7B, Rx module 220 may reuse the same iterative FEC decoder 320 and/or set of iterative FEC decoders 320 using a loop. In some implementations, Rx module 220 may use a faster clock rate for FEC decoding than the incoming clock rate of the data streams. In some implementations, the clock rate may be K times faster than the fastest incoming clock rate of K data streams, such that iterative FEC decoding does not introduce a delay when used to decode multiple data streams. As an example, if Rx module 220 is capable of performing N iterations at a rate R for a single data stream, then Rx module 220 may perform N iterations at a rate of R×K for K data streams. Additionally, or alternatively, Rx module may perform N/K iterations, at a rate of R, for the K data streams.

As indicated above, FIGS. 7A and 7B are provided merely as an example. Other examples are possible and may differ from what was described with regard to FIGS. 7A and 7B.

Implementations described herein assist in using a particular configuration of components in an optical receiver to decode a single data stream using iterative FEC decoding, or to decode multiple data streams, such as multiple asynchronous data streams encoded by different FEC encoders, using iterative FEC decoding.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical receiver, comprising:
    a decoder system configured to:
        receive a data stream;
        decode the data stream using a first set of forward error correction (FEC) decoders;
        determine whether to further decode the data stream using the first set of FEC decoders or a second set of FEC decoders,
            the second set of FEC decoders being different from the first set of FEC decoders; and
        selectively perform a first action or a second action based on determining whether to further decode the data stream,
            the first action including providing the data stream to the first set of FEC decoders or the second set of FEC decoders for further decoding when the data stream is to be further decoded,
            the second action including outputting the data stream, without further decoding the data stream using the first set of FEC decoders or the second set of FEC decoders, when the data stream is not to be further decoded.

2. The optical receiver of claim 1, where the decoder system, when determining whether to further decode the data stream, is further configured to:
    receive an indication that a plurality of data streams, including the data stream, are to be decoded concurrently;
    determine not to further decode the data stream based on receiving the indication that the plurality of data streams are to be decoded concurrently; and
    where the decoder system, when selectively performing the first action or the second action, is further configured to:
        perform the second action based on determining not to further decode the data stream.

3. The optical receiver of claim 1, where the data stream is a first data stream;
    where the decoder system, when determining whether to further decode the first data stream, is further configured to:

receive, from a storage buffer, a second data stream,
  the second data stream being different than the first
  data stream;
 determine not to further decode the first data stream
  based on receiving the second data stream; and
where the decoder system, when selectively performing
  the first action or the second action, is further configured
  to:
 perform the second action based on determining not to
  further decode the first data stream.
4. The optical receiver of claim 1, where the data stream is
a first data stream;
where the decoder system, when determining whether to
  further decode the first data stream, is further configured
  to:
 determine that the first data stream is not to be concurrently decoded with a second data stream;
 determine to further decode the first data stream based
  on determining that the first data stream is not to be
  concurrently decoded with the second data stream;
  and
where the decoder system, when selectively performing
  the first action or the second action, is further configured
  to:
 perform the first action based on determining to further
  decode the first data stream.
5. The optical receiver of claim 1, where the data stream is
a first data stream;
where the decoder system, when determining whether to
  further decode the first data stream, is further configured
  to:
 determine that the first data stream is to be concurrently
  decoded with a second data stream,
  the second data stream being different from the first
   data stream;
 determine not to further decode the first data stream
  based on determining that the first data stream is to be
  concurrently decoded with the second data stream;
  and
where the decoder system, when selectively performing
  the first action or the second action, is further configured
  to:
 perform the second action based on determining not to
  further decode the first data stream.
6. The optical receiver of claim 1, where the data stream is
a first asynchronous data stream;
where the decoder system is further configured to:
 receive a second asynchronous data stream;
 determine that the first asynchronous data stream and the
  second asynchronous data stream are to be concurrently decoded;
 decode the second asynchronous data stream using the
  first set of FEC decoders or the second set of FEC
  decoders based on determining that the first asynchronous data stream and the second asynchronous data
  stream are to be concurrently decoded;
where the decoder system, when determining whether to
  further decode the first asynchronous data stream, is
  further configured to:
 determine not to further decode the first asynchronous
  data stream based on determining that the first asynchronous data stream and the second asynchronous
  data stream are to be concurrently decoded; and
where the decoder system, when selectively performing
  the first action or the second action, is further configured
  to:
 perform the second action on the first asynchronous data
  stream based on determining not to further decode the
  first asynchronous data stream.
7. The optical receiver of claim 1, where the first set of FEC
decoders is a first set of iterative FEC decoders;
where the second set of FEC decoders is a second set of
  iterative FEC decoders; and
where the first set of iterative FEC decoders and the second
  set of iterative FEC decoders are mutually exclusive.
8. A system comprising,
an optical receiver configured to:
 receive a data stream;
 decode the data stream using a first iterative forward
  error correction (FEC) decoder;
 determine whether to further decode the data stream
  using the first iterative FEC decoder or a second iterative FEC decoder,
  the second iterative FEC decoder being different from
   the first iterative FEC decoder; and
 selectively perform a first action or a section action
  based on determining whether to further decode the
  data stream,
  the first action including providing the data stream to
   the first iterative FEC decoder or the second iterative FEC decoder for further decoding when the
   data stream is to be further decoded,
  the second action including preventing the data
   stream from being provided to the first iterative
   FEC decoder or the second iterative FEC decoder
   when the data stream is not to be further decoded.
9. The system of claim 8, where the optical receiver is
further configured to:
 determine a clock rate associated with the data stream; and
 provide, to the first iterative FEC decoder, information that
  identifies the clock rate,
  the information that identifies the clock rate causing the
   first iterative FEC decoder to decode the data stream
   based on the clock rate.
10. The system of claim 8, where the optical receiver is
further configured to:
 receive encapsulation information associated with the data
  stream;
 identify, based on the encapsulation information, that the
  data stream is to be initially decoded by the first iterative
  FEC decoder;
 provide the data stream to the first iterative FEC decoder
  based on identifying that the data stream is to be initially
  decoded by the first iterative FEC decoder; and
where the optical receiver, when decoding the data stream
  using the first iterative FEC decoder, is further configured to:
 decode the data stream using the first iterative FEC
  decoder based on providing the data stream to the first
  iterative FEC decoder.
11. The system of claim 8, where the optical receiver, when
determining whether to further decode the data stream, is
further configured to:
 provide the data stream to a mode selection component;
 determine, using the mode selection component, a mode
  for decoding the data stream; and
where the optical receiver, when selectively performing the
  first action or the section action, is further configured to:
 selectively perform the first action or the second action
  based on determining the mode for decoding the data
  stream.

12. The system of claim 8, where the optical receiver, when selectively performing the first action or the second action, is further configured to:
perform the second action; and
where the optical receiver, when performing the second action, is further configured to:
apply a delay to the data stream,
the delay being based on a time period for processing another data stream using the first iterative FEC decoder or the second iterative FEC decoder.

13. The system of claim 8, where the optical receiver, when determining whether to further decode the data stream, is further configured to:
receive an indication that a plurality of data streams, including the data stream, are to be decoded concurrently;
determine not to further decode the data stream based on receiving the indication that the plurality of data streams are to be decoded concurrently; and
where the optical receiver, when selectively performing the first action or the second action, is further configured to:
perform the second action on the data stream based on determining not to further decode the data stream.

14. The system of claim 8, where the optical receiver, when determining whether to further decode the data stream, is further configured to:
receive, from a storage buffer, another data stream,
the other data stream being different from the data stream;
determine not to further decode the data stream based on receiving the other data stream; and
where the optical receiver, when selectively performing the first action or the second action, is further configured to:
perform the second action on the data stream based on determining not to further decode the data stream.

15. A method, comprising:
receiving, by an optical receiver, a data stream;
decoding, by the optical receiver, the data stream using a first forward error correction (FEC) decoder;
determining, by the optical receiver, whether to further decode the data stream using the first FEC decoder or a second FEC decoder,
the second FEC decoder being different from the first FEC decoder; and
selectively performing, by the optical receiver, a first action or a section action based on determining whether to further decode the data stream,
the first action including providing the data stream to the first FEC decoder or the second FEC decoder, for further decoding, based on determining that the data stream is to be further decoded,
the second action including preventing the data stream from being provided to the first FEC decoder or the second FEC decoder, for further decoding, based on determining that the data stream is not to be further decoded.

16. The method of claim 15, where determining whether to further decode the data stream further comprises:
receiving an indication that a plurality of asynchronous data streams, including the data stream, are to be concurrently decoded;
determining that the data stream is not to be further decoded based on receiving the indication that the plurality of asynchronous data streams are to be concurrently decoded; and
where selectively performing the first action or the second action further comprises:
performing the second action on the data stream based on determining that the data stream is not to be further decoded.

17. The method of claim 15, where determining whether to further decode the data stream further comprises:
receiving an indication that a the data stream is a synchronous data stream;
determining that the data stream is to be further decoded based on receiving the indication that the data stream is a synchronous data stream; and
where selectively performing the first action or the second action further comprises:
performing the first action on the data stream based on determining that the data stream is to be further decoded.

18. The method of claim 15, where determining whether to further decode the data stream further comprises:
receiving another data stream,
the other data stream being different from the data stream;
determining that the data stream is not to be further decoded based on receiving the other data stream; and
where selectively performing the first action or the second action further comprises:
performing the second action on the data stream based on determining that the data stream is not to be further decoded.

19. The method of claim 15, where determining whether to further decode the data stream further comprises:
determining a quantity of times that the data stream has been decoded by the first FEC decoder;
determining whether the quantity of times satisfies a threshold; and
where selectively performing the first action or the second action further comprises:
selectively performing the first action or the second action based on determining whether the quantity of times satisfies the threshold.

20. The method of claim 15, where the data stream is a first asynchronous data stream;
where the method further comprises:
receiving a second asynchronous data stream;
decoding the second asynchronous data stream using the first FEC decoder or the second FEC decoder;
where determining whether to further decode the first asynchronous data stream further comprises:
determining that the first asynchronous data stream is not to be further decoded based on receiving the second asynchronous data stream; and
where selectively performing the first action or the second action further comprises:
performing the second action on the first asynchronous data stream based on determining that the first asynchronous data stream is not to be further decoded.

* * * * *